(12) United States Patent
Han

(10) Patent No.: US 11,594,529 B2
(45) Date of Patent: Feb. 28, 2023

(54) NONVOLATILE MEMORY DEVICE CONTROLLING FOR MISALIGNMENT

(71) Applicant: SAMSUNG ELECTRONICS CO., LTD., Suwon-si (KR)

(72) Inventor: Min Chul Han, Yongin-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 78 days.

(21) Appl. No.: 17/345,102

(22) Filed: Jun. 11, 2021

(65) Prior Publication Data

US 2022/0059522 A1 Feb. 24, 2022

(30) Foreign Application Priority Data

Aug. 20, 2020 (KR) ........................ 10-2020-0104594

(51) Int. Cl.
*H01L 27/02* (2006.01)
*H01L 27/22* (2006.01)
*H01L 23/544* (2006.01)
*H01L 27/24* (2006.01)

(52) U.S. Cl.
CPC ........ *H01L 27/0207* (2013.01); *H01L 23/544* (2013.01); *H01L 27/224* (2013.01); *H01L 27/2427* (2013.01); *H01L 2223/54426* (2013.01)

(58) Field of Classification Search
CPC . H01L 27/0207; H01L 23/544; H01L 27/224; H01L 27/2427; H01L 2223/54426; H01L 27/2463; H01L 27/2481; H01L 27/222; H01L 43/02; H01L 45/1233

USPC .............................................. 257/5
See application file for complete search history.

(56) References Cited

U.S. PATENT DOCUMENTS

| | | | | |
|---|---|---|---|---|
| 6,034,882 A * | 3/2000 | Johnson | ............. | H01L 27/1021 365/103 |
| 6,178,543 B1 * | 1/2001 | Chen | ..................... | H01L 23/528 716/55 |
| 8,068,364 B2 * | 11/2011 | Maejima | .................. | G11C 5/02 365/185.11 |
| 9,263,396 B2 * | 2/2016 | Shen | ................. | H01L 21/31051 |
| 10,056,336 B2 | 8/2018 | Koketsu et al. | | |
| 2003/0114007 A1 * | 6/2003 | Park | .................. | H01L 27/10855 257/E21.507 |

(Continued)

FOREIGN PATENT DOCUMENTS

| KR | 1998-015955 A | 5/1998 |
|---|---|---|
| KR | 2001-0036817 A | 5/2001 |
| KR | 10-0421051 B1 | 3/2004 |

(Continued)

*Primary Examiner* — Duy T Nguyen
(74) *Attorney, Agent, or Firm* — Lee IP Law, P.C.

(57) ABSTRACT

A memory device includes a cell block including memory cells; a control logic; and a correction block in a dummy region in a core region. The correction block may include first metal lines extending in a first direction; vias extending in a second direction; and second metal lines extending in a third direction. Each of the second metal lines may have a metal center line defining a center of each of the second metal lines in the first direction. Each of the vias may have a via center line defining a center of each of the vias in the first direction. At least one metal center line and at least one via center line may be spaced apart from each other by a first gap in the first direction.

20 Claims, 10 Drawing Sheets

(56) References Cited

U.S. PATENT DOCUMENTS

2012/0263003 A1* 10/2012 Sakakibara ....... G11C 11/40618
                                                        365/222
2018/0040669 A1*  2/2018 Wu ........................ H01L 45/08

FOREIGN PATENT DOCUMENTS

| KR | 2004-0057632 A | 7/2004 |
| KR | 2005-0098438 A | 10/2005 |

* cited by examiner

NONVOLATILE MEMORY DEVICE CONTROLLING FOR MISALIGNMENT

CROSS-REFERENCE TO RELATED APPLICATION

Korean Patent Application No. 10-2020-0104594, filed on Aug. 20, 2020, in the Korean Intellectual Property Office, and entitled: "Nonvolatile Memory Device for Controlling Misalignment," is incorporated by reference herein in its entirety.

BACKGROUND

1. Field

Embodiments relate to a memory device controlling for misalignment.

2. Description of the Related Art

When performing photo alignment, a dummy region in a scribe lane and a core region should be used efficiently to prevent misalignment, such as rotation and distortion.

SUMMARY

Embodiments are directed to a memory device, including: a cell block in a cell block region, and including a plurality of memory cells; a control logic in a core region adjacent to the cell block region, and configured to control the cell block; and a correction block in a dummy region in the core region, and including a plurality of correction patterns. The correction block may include: a plurality of first metal lines extending in a first direction; a plurality of vias extending in a second direction crossing the first direction; and a plurality of second metal lines extending in a third direction crossing the first direction and the second direction. Each of the plurality of second metal lines may have a metal center line defining a center of each of the plurality of second metal lines in the first direction. Each of the plurality of vias may have a via center line defining a center of each of the plurality of vias in the first direction. At least one metal center line of the plurality of second metal lines and at least one via center line of the plurality of vias may be spaced apart from each other by a first gap in the first direction.

Embodiments are also directed to a memory device, including: a first region having a cell block including a plurality of memory cells for storing data; a second region having a control logic for controlling transmission of the data, the second region being adjacent to the first region; and a third region having a correction block including a plurality of correction patterns for measuring an alignment error of the plurality of memory cells, the third region being in the second region. The correction block may include: a plurality of first metal lines extending in a first direction; a plurality of vias extending in a second direction crossing the first direction; and a plurality of second metal lines extending in a third direction crossing the first direction and the second direction. Each of the plurality of second metal lines may have a metal center line defining a center of each of the plurality of second metal lines in the first direction. Each of the plurality of vias may have a via center line defining a center of each of the plurality of vias in the first direction. At least one metal center line of the plurality of second metal lines and at least one via center line of the plurality of vias may be spaced apart from each other by a first gap in the first direction.

Embodiments are also directed to a memory device, including: a cell array configured to store data; a row decoder configured to transmit the data to the cell array; a column decoder configured to read the data from the cell array; a read/write circuit configured to apply a bias to the column decoder; and a control logic configured to control the row decoder and the read/write circuit. The cell array may include: a cell block in a cell block region and including a plurality of memory cells; a control logic in a core region adjacent to the cell block region and configured to control the cell block; and a correction block in a dummy region formed in the core region and including a plurality of correction patterns. The correction block may include: a plurality of first metal lines extending in a first direction; a plurality of vias extending in a second direction crossing the first direction; and a plurality of second metal lines extending in a third direction crossing the first direction and the second direction. Each of the plurality of second metal lines may have a metal center line defining a center of each of the plurality of second metal lines in the first direction. Each of the plurality of vias may have a via center line defining a center of each of the plurality of vias in the first direction. At least one metal center line of the plurality of second metal lines and at least one via center line of the plurality of vias may be spaced apart from each other by a first gap in the first direction.

BRIEF DESCRIPTION OF THE DRAWINGS

Features will become apparent to those of skill in the art by describing in detail example embodiments with reference to the attached drawings in which.

DETAILED DESCRIPTION

Figure 1:
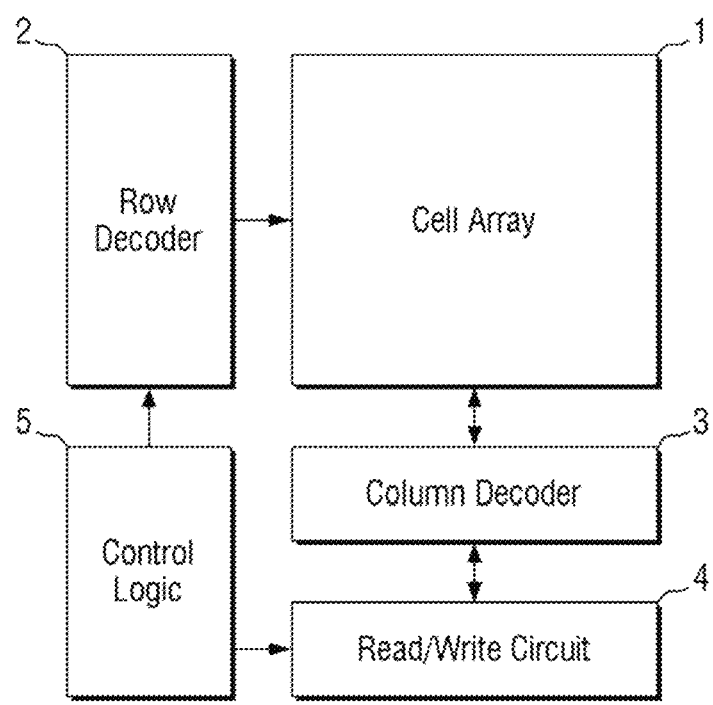
FIG. 1 is an example block diagram illustrating a nonvolatile memory device according to an example embodiment.

FIG. 1 is an example block diagram illustrating a nonvolatile memory device according to an example embodiment.

Referring to FIG. 1, a nonvolatile memory device according to an example embodiment may include a cell array 1, a row decoder 2, a column decoder 3, and a read/write circuit 4, and a control logic 5.

The cell array 1 may include a plurality of memory cells. The cell array 1 may include a plurality of word lines and a plurality of bit lines. Memory cells may be connected to points at which the word lines and the bit lines cross each other. The cell array 1 will be described below in more detail with reference to FIG. 2.

The row decoder 2 may be connected to the cell array 1 through the word lines. The row decoder 2 may select one of the plurality of word lines by decoding an externally input address.

The column decoder 3 may be connected to the cell array 1 through the bit lines. The column decoder 3 may select one of the plurality of bit lines by decoding an externally input address. The bit line selected by the column decoder 3 may be connected to the read/write circuit 4.

The read/write circuit 4 may provide a bit line bias for accessing the selected memory cell under the control of the control logic 5. For example, the read/write circuit 4 may provide a bit line bias to the selected bit line to write or read input data into or from a memory cell.

The control logic 5 may output control signals for controlling the nonvolatile memory device according to a command signal provided from the outside. The control signals output from the control logic 5 may control the read/write circuit 4.

Figure 2:
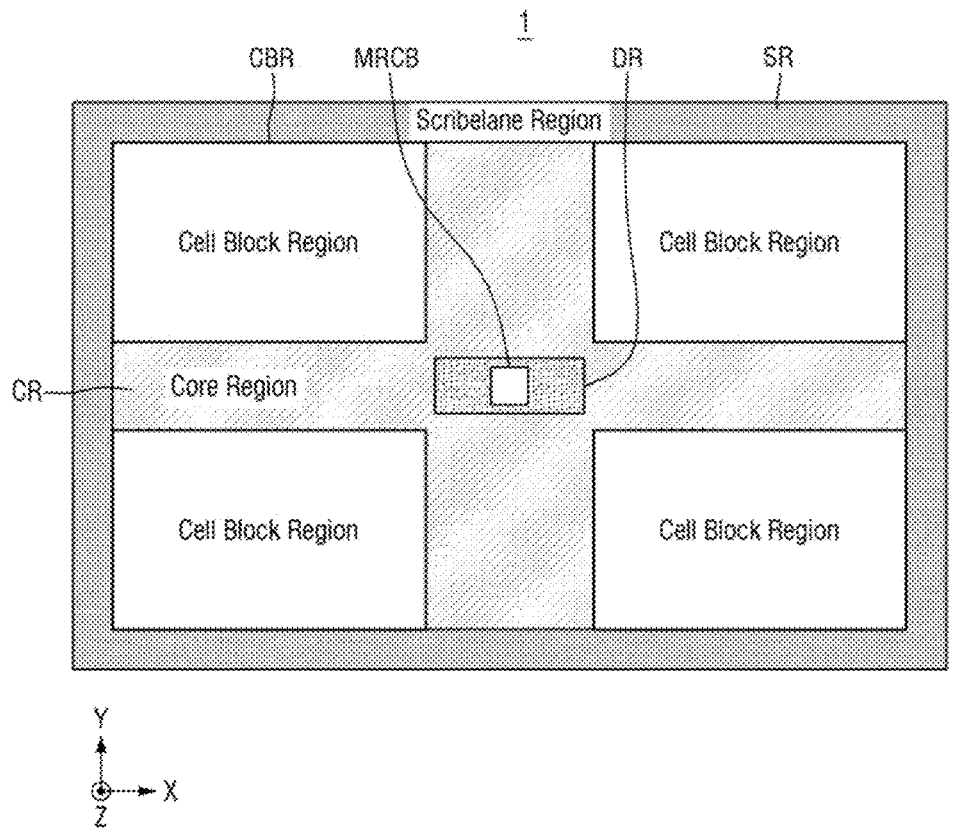
FIG. 2 is a diagram illustrating a cell array according to an example embodiment.
Figure 3:
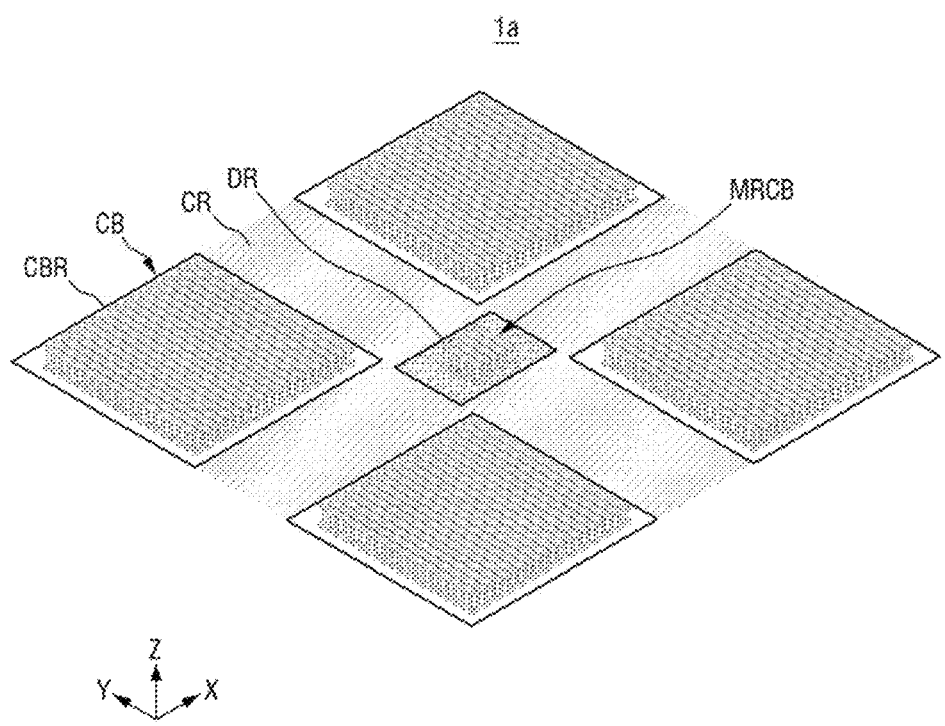
FIG. 3 is a perspective view illustrating a cell array according to an example embodiment.

FIG. 2 is a diagram illustrating a cell array according to an example embodiment. FIG. 3 is a perspective view illustrating a cell array according to an example embodiment.

FIG. 2 illustrates the cell array 1, and FIG. 3 illustrates a cell array 1a. For reference, the cell array 1 of FIG. 2 is a top view in a block diagram, the cell array 1a of FIG. 3 is a perspective view, and the cell array 1 of FIG. 2 and the cell array 1a of FIG. 3 may be the same cell array. For convenience, the cell array 1a will be understood with reference to the description of the cell array 1.

Referring to FIGS. 2 and 3, the cell array 1 may include a plurality of cell block regions CBR, a core region CR, a dummy region DR, and a scribelane region SR.

The plurality of cell block regions CBR may be disposed to be spaced apart from each other in a first direction X and/or a second direction Y. Each cell block regions CBR may include a cell block CB including a plurality of memory cells. The cell block CB may include, e.g., phase-change random access memory (PRAM) cells. In another example embodiment, the cell block CB may include, e.g., magnetic random access memory (MRAM) cells. A detailed description of the cell block CB will be given with reference to FIGS. 13 to 16 below.

Herein, the first direction is exemplified as the X direction, the second direction is exemplified as the Y direction, and the first direction and the second direction are exemplified as being orthogonal to each other, but the first direction and the second direction may be directions that cross each other nonorthogonally. In addition, the third direction is exemplified as a Z direction and is exemplified as being orthogonal to the first direction and the second direction, but the third direction may be a direction that crosses the first direction and the second direction nonorthogonally.

The core region CR may be disposed between the plurality of cell block regions CBR. In an example embodiment, a circuit for controlling the cell block CB in the cell block region CBR may be in the core region CR. The core region CR may be formed to extend in the first direction X and/or the second direction Y.

The dummy region DR may be in the core region CR. When a plurality of memory cell arrays 1 are stacked in the third direction Z, dummy cells that perform balancing not to be inclined may be in the dummy region DR. In an example embodiment, a correction block MRCB for controlling misalignment of the cell block CB may be in the cell block region CBR.

In more detail, in order to check whether the bit line and the word line of the memory cell constituting the cell block CB and the via connecting the bit line and the word line are misaligned, it may be determined whether the memory cell constituting the cell block CB is misaligned based on the correction block MRCB in the dummy region DR. This will be described in detail with reference to FIGS. 4 to 10 below.

In order to delimit the plurality of cell blocks CB from each other, the scribelane region SR may be disposed along the outside of the cell block regions CBR and the core region CR. The scribelane region SR may delimit one chip and may provide a region for sawing.

The disposition and/or shape of the cell block region CBR, the core region CR, the dummy region DR, and the scribelane region SR in the region of the cell array 1 of the nonvolatile memory device according to an example embodiment is not limited to the above.

Hereinafter, an operation of checking whether the cell block CB is misaligned through the correction block MRCB will be described with reference to FIGS. 4 to 10.

Figure 4:
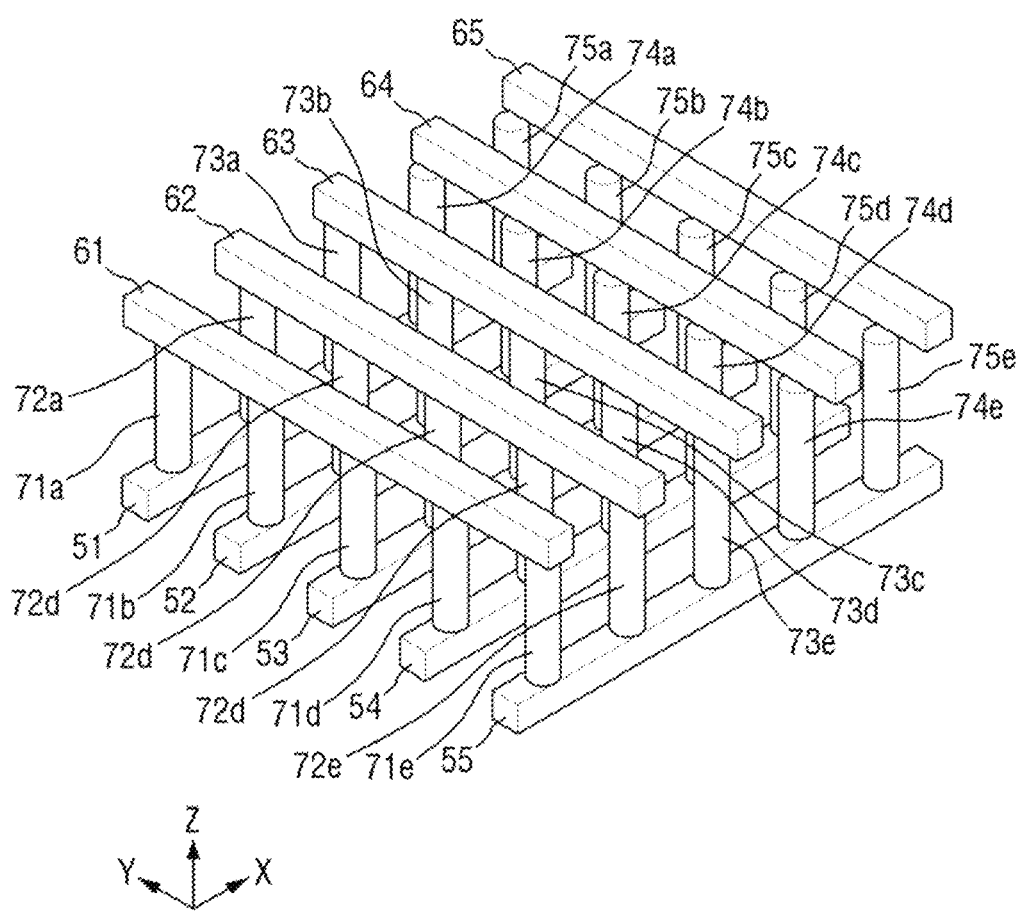
FIG. 4 is a perspective view illustrating a correction block included in a cell array according to an example embodiment.

FIG. 4 is a perspective view illustrating a correction block included in a cell array according to an example embodiment.

Referring to FIGS. 3 and 4, since the misalignment occurring in the cell block CB may be very fine, it may be difficult to determine whether the misalignment of the cell block CB has occurred. Accordingly, as in the correction block MRCB of FIG. 4, some metal lines (for example, 61, 62, 64, and 65) may be disposed to deviate from the vias connected to each of the metal lines in a predetermined direction.

The descriptions below refer to first metal lines 51 to 55, and second metal lines 61 to 65. The plurality of first metal lines 51 to 55 and the plurality of second metal lines 61 to 65 may constitute the plurality of word lines or the plurality of bit lines, respectively. In an example embodiment, the plurality of first metal lines 51 to 55 may constitute the plurality of word lines, and the plurality of second metal lines 61 to 65 may constitute the plurality of bit lines. In another example embodiment, the plurality of first metal lines 51 to 55 may constitute the plurality of bit lines, and the plurality of second metal lines 61 to 65 may constitute the plurality of word lines.

Referring to FIGS. 3 and 4, a plurality of vias 71a to 71e extending in the third direction Z may be disposed on the plurality of first metal lines 51 to 55 extending in the first direction X, respectively. The plurality of vias 71a to 71e may be disposed to be spaced apart from each other in the second direction Y. The second metal line 61 extending in the second direction Y may be disposed on the plurality of vias 71a to 71e. The second metal line 61 may be disposed to deviate from the center of the plurality of vias 71a to 71e in the first direction X by a predetermined gap. Thus, the second metal line 61 and the plurality of vias 71a to 71e may form eccentricity with respect to each other, e.g., may have center lines that are offset with respect to each other.

A plurality of vias 72a to 72e extending in the third direction Z may be disposed on the plurality of first metal lines 51 to 55 extending in the first direction X, respectively. The plurality of vias 72a to 72e may be disposed to be spaced apart from each other in the second direction Y. The second metal line 62 extending in the second direction Y may be disposed on the plurality of vias 72a to 72e. The second metal line 62 may be disposed to deviate from the center of the plurality of vias 72a to 72e in the first direction X by a predetermined gap. Thus, the second metal line 62 and the plurality of vias 72a to 72e may form eccentricity with respect to each other.

A plurality of vias 73a to 73e extending in the third direction Z may be disposed on the plurality of first metal lines 51 to 55 extending in the first direction X, respectively. The plurality of vias 73a to 73e may be disposed to be spaced apart from each other in the second direction Y. The second metal line 63 extending in the second direction Y may be disposed on the plurality of vias 73a to 73e. The second metal line 63 may be disposed without deviating from the center of the plurality of vias 73a to 73e. Thus, the second metal line 63 and the plurality of vias 73a to 73e may be formed concentrically.

A plurality of vias 74a to 74e extending in the third direction Z may be disposed on the plurality of first metal lines 51 to 55 extending in the first direction X, respectively. The plurality of vias 74a to 74e may be disposed to be spaced apart from each other in the second direction Y. The second metal line 64 extending in the second direction Y may be disposed on the plurality of vias 74a to 74e. The second metal line 64 may be disposed to deviate from the center of the plurality of vias 74a to 74e in the first direction X by a predetermined gap. Thus, the second metal line 64 and the plurality of vias 74a to 74e may form eccentricity with respect to each other.

A plurality of vias 75a to 75e extending in the third direction Z may be disposed on the plurality of first metal lines 51 to 55 extending in the first direction X, respectively. The plurality of vias 75a to 75e may be disposed to be spaced apart from each other in the second direction Y. The second metal line 65 extending in the second direction Y may be disposed on the plurality of vias 75a to 75e. The second metal line 65 may be disposed to deviate from the center of the plurality of vias 75a to 75e in the first direction X by a predetermined gap. Thus, the second metal line 65 and the plurality of vias 75a to 75e may form eccentricity with respect to each other.

In the present example embodiment, the second metal lines 61, 62, 64, and 65 are formed to have eccentricity with respect to each via, so that a minute misalignment occurring in the cell block CB may be determined. Since the misalignment resulting from the preformed eccentricity is misalignment of a measurable degree, a minute misalignment occurring in the cell block CB may be determined through the preformed eccentricity in the correction block MRCB.

Hereinafter, the shape of the eccentricity formed in the correction block MRCB will be described with reference to FIGS. 5 to 6. For reference, the number and the disposition shape of the first metal lines, the vias, and the second metal lines forming the correction block MRCB are not limited thereto.

Figure 5:
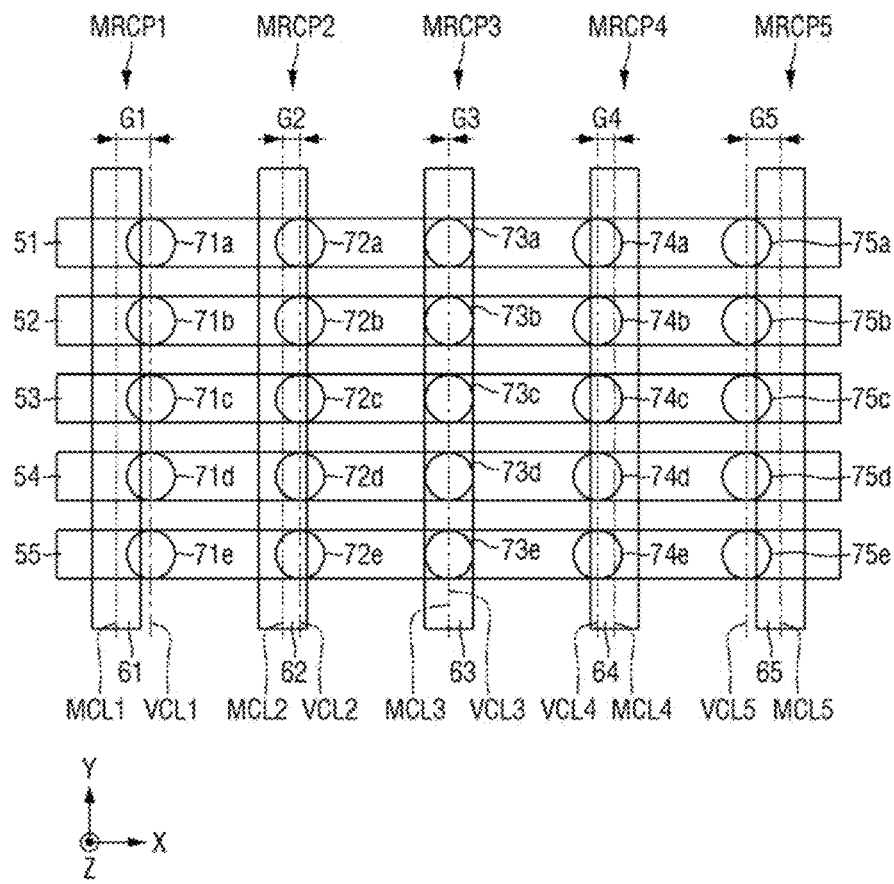
FIG. 5 is a layout diagram illustrating a correction block included in a cell array according to an example embodiment.

FIG. 5 is a layout diagram illustrating a correction block included in a cell array according to an example embodiment.

Referring to FIG. 5, the correction block included in the cell array according to an example embodiment may include a plurality of correction patterns MRCP1 to MRCP5.

Each of the correction patterns MRCP1 to MRCP5 may include the plurality of first metal lines, the plurality of vias, and the second metal line.

The first correction pattern MRCP1 may include the plurality of first metal lines 51 to 55 extending in the first direction X, the plurality of vias 71a to 71e disposed on the plurality of first metal lines 51 to 55, respectively, and the second metal line 61 disposed on the plurality of vias 71a to 71e. The plurality of vias 71a to 71e may extend in the third direction Z, and the second metal line 61 may extend in the second direction Y. A center of the width of the second metal line 61 in the first direction X may be defined, and a first metal center line MCL1, which is one imaginary line extending in the second direction Y, may be defined. In addition, a center of the plurality of vias 71a to 71e in the first direction X may be defined, and a first via center line VCL1, which is another imaginary line extending in the second direction Y, may be defined. The first correction pattern MRCP1 may be such that the first metal center line MCL1 and the first via center line VCL1 are disposed to be spaced apart from each other by a first gap G1 in the first direction X. Thus, the second metal line 61 and the plurality of vias 71a to 71e of the first correction pattern MRCP1 may form eccentricity with respect to each other.

The second correction pattern MRCP2 may include the plurality of first metal lines 51 to 55 extending in the first direction X, the plurality of vias 72a to 72e disposed on the plurality of first metal lines 51 to 55, respectively, and the second metal line 62 disposed on the plurality of vias 72a to 72e. The plurality of vias 72a to 72e may extend in the third direction Z, and the second metal line 62 may extend in the second direction Y. A center of the width of the second metal line 62 in the first direction X may be defined, and a second metal center line MCL2, which is one imaginary line extending in the second direction Y, may be defined. In addition, a center of the plurality of vias 72a to 72e in the first direction X may be defined, and a second via center line VCL2, which is another imaginary line extending in the second direction Y, may be defined. The second correction pattern MRCP2 may be such that the second metal center line MCL2 and the second via center line VCL2 are disposed to be spaced apart from each other by a second gap G2 in the first direction X. Thus, the second metal line 62 and the plurality of vias 72a to 72e of the second correction pattern MRCP2 may form eccentricity with respect to each other.

The third correction pattern MRCP3 may include the plurality of first metal lines 51 to 55 extending in the first direction X, the plurality of vias 73a to 73e disposed on the plurality of first metal lines 51 to 55, respectively, and the second metal line 63 disposed on the plurality of vias 73a to 73e. The plurality of vias 73a to 73e may extend in the third direction Z, and the second metal line 63 may extend in the second direction Y. A center of the width of the second metal line 63 in the first direction X may be defined, and a third metal center line MCL3, which is one imaginary line extending in the second direction Y, may be defined. In addition, a center of the plurality of vias 73a to 73e in the first direction X may be defined, and a third via center line VCL3, which is another imaginary line extending in the second direction Y, may be defined. In the third correction pattern MRCP3, the third metal center line MCL3 and the third via center line VCL3 may coincide with each other. Thus, a third gap G3, which is a gap between the third metal center line MCL3 and the third via center line VCL3, may be zero. Thus, the second metal line 63 and the plurality of vias 73a to 73e of the third correction pattern MRCP3 may be formed concentrically with respect to each other.

The fourth correction pattern MRCP4 may include the plurality of first metal lines 51 to 55 extending in the first direction X, the plurality of vias 74a to 74e disposed on the plurality of first metal lines 51 to 55, respectively, and the second metal line 64 disposed on the plurality of vias 74a to 74e. The plurality of vias 74a to 74e may extend in the third direction Z, and the second metal line 64 may extend in the second direction Y. A center of the width of the second metal line 64 in the first direction X may be defined, and a fourth metal center line MCL4, which is one imaginary line extending in the second direction Y, may be defined. In addition, a center of the plurality of vias 74a to 74e in the first direction X may be defined, and a fourth via center line VCL4, which is another imaginary line extending in the second direction Y, may be defined. The fourth correction pattern MRCP4 may be such that the fourth metal center line MCL4 and the fourth via center line VCL4 are disposed to be spaced apart from each other by a fourth gap G4 in the first direction X. Thus, the second metal line 64 and the plurality of vias 74a to 74e of the fourth correction pattern MRCP4 may form eccentricity with respect to each other.

The fifth correction pattern MRCP5 may include the plurality of first metal lines 51 to 55 extending in the first direction X, the plurality of vias 75a to 75e disposed on the plurality of first metal lines 51 to 55, respectively, and the second metal line 65 disposed on the plurality of vias 75a to 75e. The plurality of vias 75a to 75e may extend in the third direction Z, and the second metal line 65 may extend in the second direction Y. A center of the width of the second metal line 65 in the first direction X may be defined, and a fifth metal center line MCL5, which is one imaginary line extending in the second direction Y, may be defined. In addition, a center of the plurality of vias 75a to 75e in the first direction X may be defined, and a fifth via center line VCL5, which is another imaginary line extending in the second direction Y, may be defined. The fifth correction pattern MRCP5 may be such that the fifth metal center line MCL5 and the fifth via center line VCL5 are disposed to be spaced apart from each other by a fifth gap G5 in the first direction X. Thus, the second metal line 65 and the plurality of vias 75a to 75e of the fifth correction pattern MRCP5 may form eccentricity with respect to each other.

At least one of the correction patterns in the correction block according to an example embodiment may have eccentricity. In an example embodiment, only one of the plurality of correction patterns may have eccentricity and the rest may have concentricity. However, the disposition of the correction patterns in the correction block according to an example embodiment is not limited thereto, and all correction patterns may have eccentricity.

Hereinafter, the correction block of FIG. 4 according to an example embodiment is described as being viewed from the front with reference to FIG. 6. FIG. 6 is a front view illustrating a correction block included in a cell array according to an example embodiment.

Figure 6:
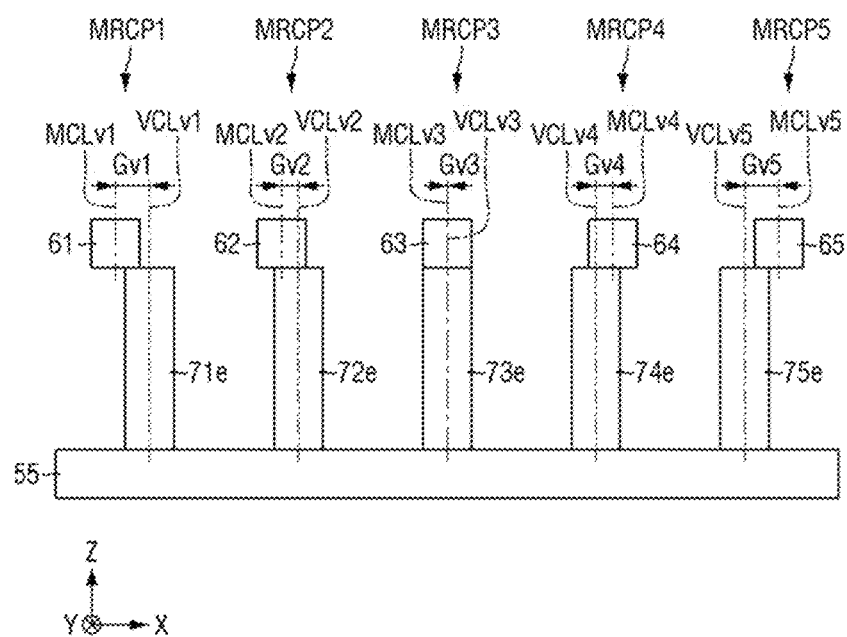
FIG. 6 is a front view illustrating a correction block included in a cell array according to an example embodiment.

Referring to FIG. 6, the correction block according to an example embodiment may include the plurality of correction patterns MRCP1 to MRCP5.

Each of the correction patterns MRCP1 to MRCP5 may include the first metal line, the via, and the second metal line.

The first correction pattern MRCP1 may include the first metal line 55 extending in the first direction X, the via 71e disposed on the first metal line 55, and the second metal line 61 disposed on the via 71e. The via 71e may extend in the third direction Z, and the second metal line 61 may extend in the second direction Y. A center of the width of the second metal line 61 in the first direction X may be defined, and a first metal vertical center line MCLv1, which is one imaginary line extending in the third direction Z, may be defined. In addition, a center of the via 71e in the first direction X may be defined, and a first via vertical center line VCLv1, which is another imaginary line extending in the third direction Z, may be defined. The first correction pattern MRCP1 may be such that the first metal vertical center line MCLv1 and the first via vertical center line VCLv1 are disposed to be spaced apart from each other by a first vertical gap Gv1 in the first direction X. Thus, the second metal line 61 and the via 71e of the first correction pattern MRCP1 may form eccentricity with respect to each other.

The second correction pattern MRCP2 may include the first metal line 55 extending in the first direction X, the via 72e disposed on the first metal line 55, and the second metal line 62 disposed on the via 72e. The via 72e may extend in the third direction Z, and the second metal line 62 may extend in the second direction Y. A center of the width of the second metal line 62 in the first direction X may be defined, and a second metal vertical center line MCLv2, which is one imaginary line extending in the third direction Z, may be defined. In addition, a center of the via 72e in the first direction X may be defined, and a second via vertical center line VCLv2, which is another imaginary line extending in the third direction Z, may be defined. The second correction pattern MRCP2 may be such that the second metal vertical center line MCLv2 and the second via vertical center line VCLv2 are disposed to be spaced apart from each other by a second vertical gap Gv2 in the first direction X. Thus, the second metal line 62 and the via 72e of the second correction pattern MRCP2 may form eccentricity with respect to each other.

The third correction pattern MRCP3 may include the first metal line 55 extending in the first direction X, the via 73e disposed on the first metal line 55, and the second metal line 63 disposed on the via 73e. The via 73e may extend in the third direction Z, and the second metal line 63 may extend in the second direction Y. A center of the width of the second metal line 63 in the first direction X may be defined, and a third metal vertical center line MCLv3, which is one imaginary line extending in the third direction Z, may be defined. In addition, a center of the via 73e in the first direction X may be defined, and a third via vertical center line VCLv3, which is another imaginary line extending in the third direction Z, may be defined. In the third correction pattern MRCP3, the third metal vertical center line MCLv3 and the third via vertical center line VCLv3 may be disposed to coincide with each other. Thus, the third metal line 63 and the via 73e of the third correction pattern MRCP3 may be formed concentrically with each other.

The fourth correction pattern MRCP4 may include the first metal line 55 extending in the first direction X, the via 74e disposed on the first metal line 55, and the second metal line 64 disposed on the via 74e. The via 74e may extend in the third direction Z, and the second metal line 64 may extend in the second direction Y. A center of the width of the second metal line 64 in the first direction X may be defined, and a fourth metal vertical center line MCLv4, which is one imaginary line extending in the third direction Z, may be defined. In addition, a center of the via 74e in the first direction X may be defined, and a fourth via vertical center line VCLv4, which is another imaginary line extending in the third direction Z, may be defined. The fourth correction pattern MRCP4 may be such that the fourth metal vertical center line MCLv4 and the fourth via vertical center line VCLv4 are disposed to be spaced apart from each other by a fourth vertical gap Gv4 in the first direction X. Thus, the fourth metal line 64 and the via 74e of the fourth correction pattern MRCP4 may form eccentricity with respect to each other.

The fifth correction pattern MRCP5 may include the first metal line 55 extending in the first direction X, the via 75e disposed on the first metal line 55, and the second metal line 65 disposed on the via 75e. The via 75e may extend in the third direction Z, and the second metal line 65 may extend in the second direction Y. A center of the width of the second metal line 65 in the first direction X may be defined, and a fifth metal vertical center line MCLv5, which is one imaginary line extending in the third direction Z, may be defined. In addition, a center of the via 75e in the first direction X may be defined, and a fifth via vertical center line VCLv5, which is another imaginary line extending in the third direction Z, may be defined. The fifth correction pattern MRCP5 may be such that the fifth metal vertical center line MCLv5 and the fifth via vertical center line VCLv5 are disposed to be spaced apart from each other by a fifth vertical gap Gv5 in the first direction X. Thus, the fifth metal line 65 and the via 75e of the fifth correction pattern MRCP5 may form eccentricity with respect to each other.

Through the examples of FIGS. 7 to 10 below, embodiments of the eccentric gaps of correction patterns in the correction block according to example embodiments will be described. For reference, since the description of the gaps G1 to G5 of FIG. 5 may also be used in the description of the vertical gaps Gv1 to Gv5 of FIG. 6, the gaps G1 to G5 of FIG. 5 are described as examples.

FIGS. 7 to 10 are graphs for describing the eccentric gaps in a correction block according to example embodiments.

Figure 7:
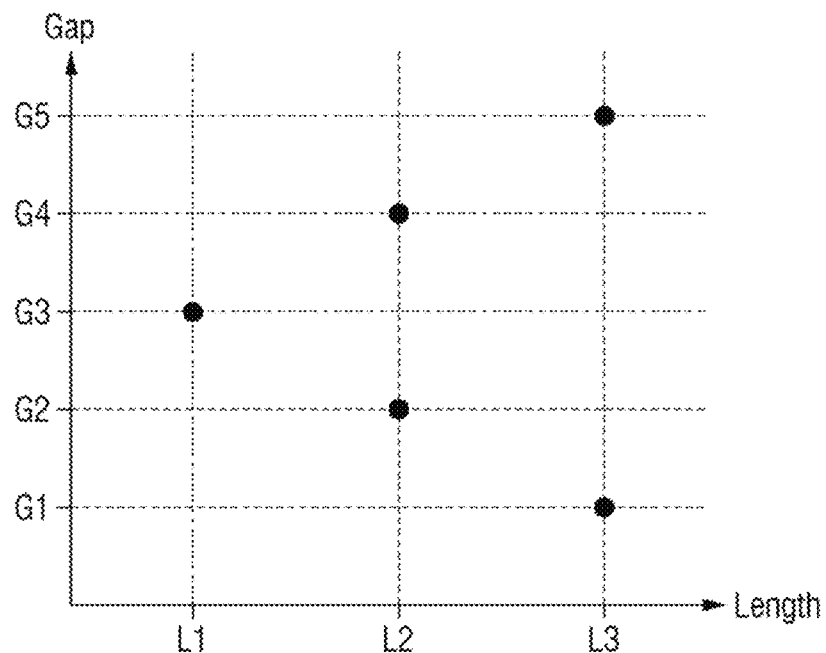
FIGS. 7 to 10 are graphs for describing the eccentric gaps in a correction block according to example embodiments.

Referring to FIGS. 5 and 7, the third gap G3 may have a shortest length L1, e.g., a length of zero. The second gap G2 and the fourth gap G4 may have a second length L2 that is greater than the first length L1. The first gap G1 and the fifth gap G5 may have a third length L3 that is greater than the second length L2. The gap (or difference) between the first length L1 and the second length L2 may be the same as the gap (or difference) between the second length L2 and the third length L3, or the gap (or difference) between the first length L1 and the second length L2 may be different from the gap (or difference) between the second length L2 and the third length L3. Further, in an example embodiment, the gap having the shortest length L1 is not limited to the third gap G3 and thus, for example, the second gap G2 may have the shortest length L1.

In an example embodiment, at least one of the first to third lengths L1 to L3 may be ¼ of 1 pitch, where the pitch may be defined as a distance between a plurality of second metal lines. In another example embodiment, at least one of the first to third lengths L1 to L3 may be ⅛ of 1 pitch, where the pitch may be defined as a distance between the plurality of second metal lines. The first to third lengths L1 to L3 are not limited thereto, and may be defined in various ratios for 1 pitch.

In an example embodiment, at least one of the first to third lengths L1 to L3 may be ¼ of 1 pitch, where the pitch may be defined as a center to center distance of adjacent second metal lines. In another example embodiment, at least one of the first to third lengths L1 to L3 may be ⅛ of 1 pitch, where the pitch may be defined as a center to center distance of adjacent second metal lines. The first to third lengths L1 to L3 are not limited thereto, and may be defined in various ratios for 1 pitch.

Figure 8:
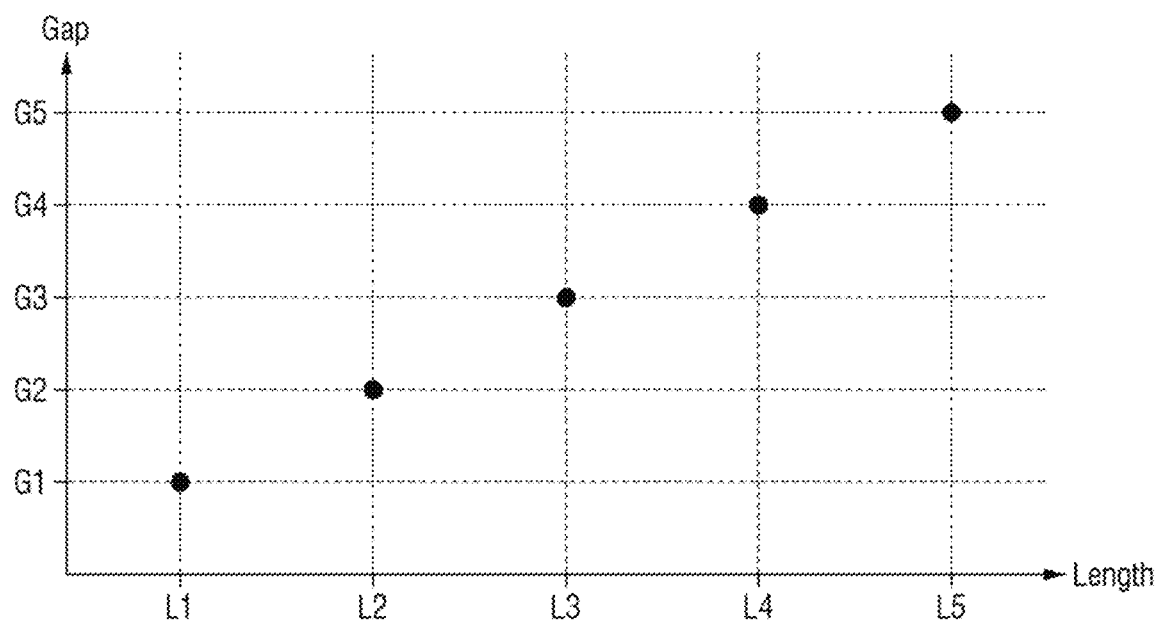

Referring to FIGS. 5 and 8, the first gap G1 may have the shortest length L1. The second gap G2 may have that second length L2 that is greater than the first length L1. The third gap G3 may have the third length L3 that is greater than the second length L2. The fourth gap G4 may have the fourth length L4 that is greater than the third length L3. The fifth gap G5 may have the fifth length L5 that is greater than the fourth length L4.

The gaps between the first to fifth lengths L1 to L5 may have a constant gap (or difference), or may have different gaps (or differences) from each other. For example, the first to fifth lengths L1 to L5 may have a rule of an arithmetic sequence in which the length increases at a constant interval from the first length L1 to the fifth length L5. As still another example, the first to fifth lengths L1 to L5 may have a rule of a geometrical sequence in which the length increases at a constant ratio from the first length L1 to the fifth length L5 by being multiplied by a constant ratio. The first length L1 may be zero. Thus, the first correction pattern MRCP1 may have concentricity.

Figure 9:
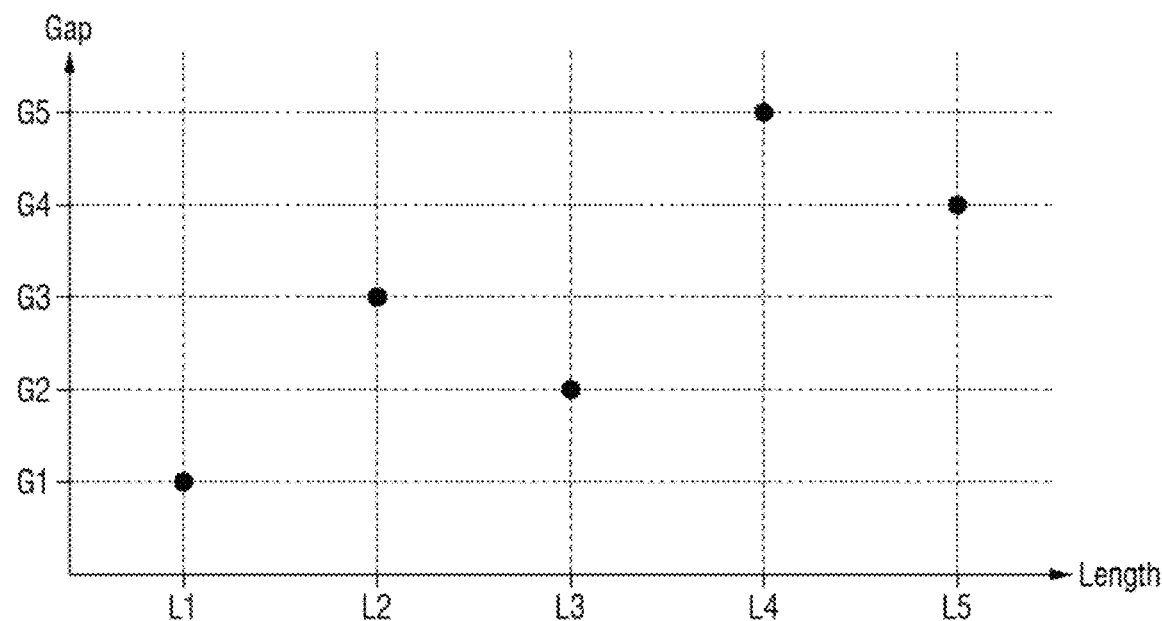

Referring to FIGS. 5 and 9, the first gap G1 may have the first length L1, the second gap G2 may have the third length L3, the third gap G3 may have the second length L2, the fourth gap G4 may have the fifth length L5, and the fifth gap G5 may have the fourth length L4. Thus, there may be no fixed ratio for the gaps between the first to the fifth lengths L1 to L5.

Figure 10:
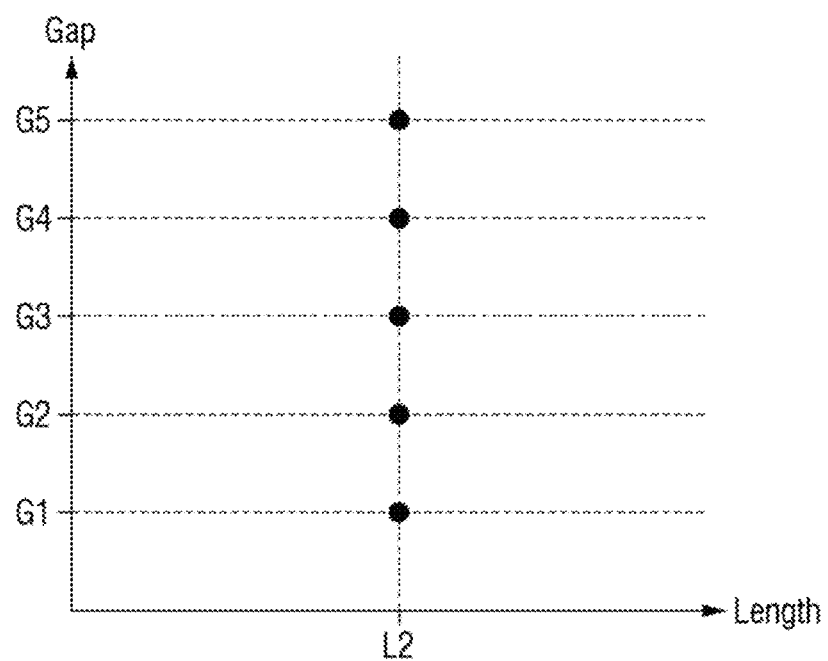

Referring to FIGS. 5 and 10, the first to fifth gaps G1 to G5 may have the second length L2. The second length L2 may be a positive integer other than zero.

According to an example embodiment, the eccentric gap of the correction pattern in the correction block may have any suitable gap while including at least one correction pattern has an eccentric gap.

Hereinafter, for simplicity of description, redundant parts of the above descriptions will be omitted.

Figure 11:
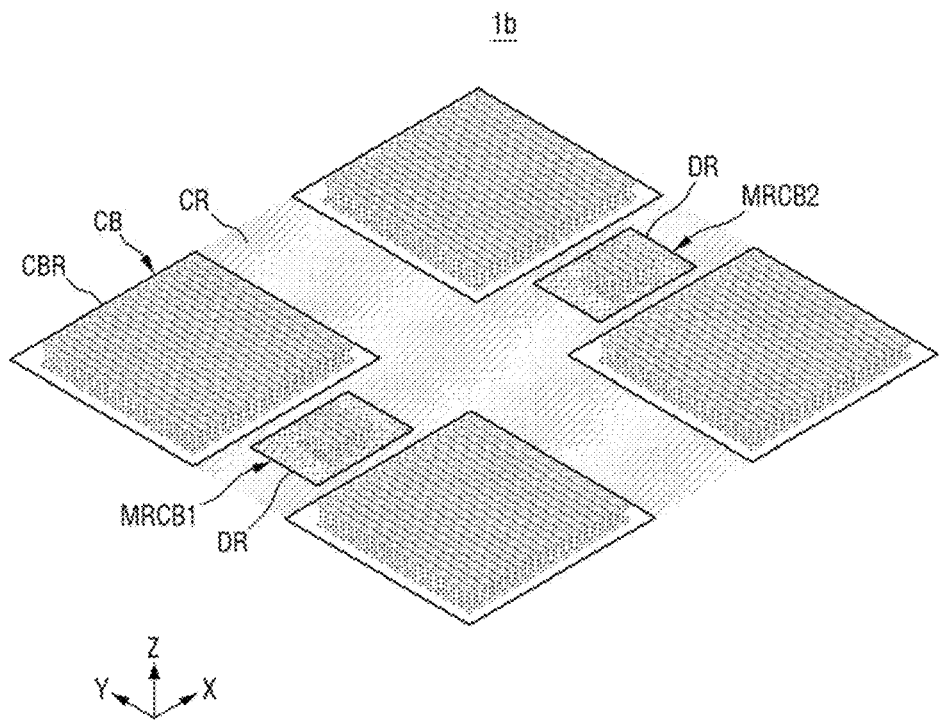
FIG. 11 is a perspective view illustrating another cell array according to an example embodiment.

FIG. 11 is a perspective view illustrating another cell array according to an example embodiment.

Referring to FIG. 11, a cell array 1b according to an example embodiment may include a plurality of correction blocks MRCB1 and MRCB2. The first correction block MRCB1 and the second correction block MRCB2 may be in the dummy region DR in the core region CR. The number of the plurality of correction blocks is not limited thereto. In addition, the position at which each of the plurality of correction blocks is disposed is not limited to the drawing, and the correction blocks may be disposed at any suitable position in the dummy region DR within the core region CR.

Figure 12:
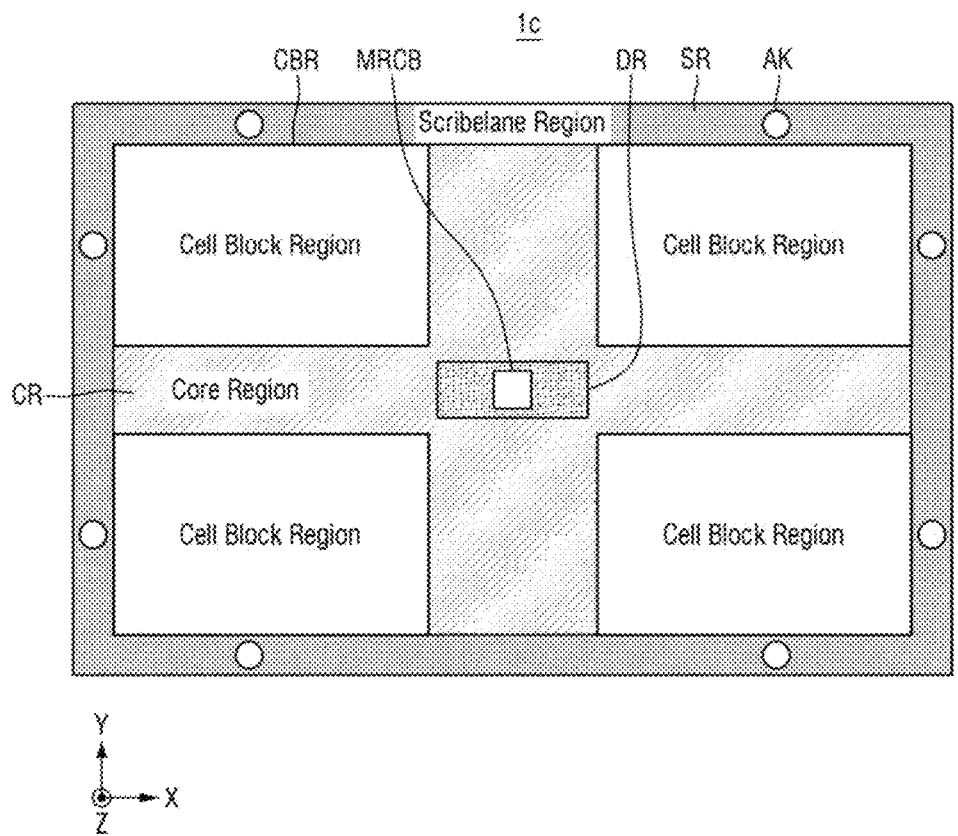
FIG. 12 is a diagram illustrating another cell array according to an example embodiment.

FIG. 12 is a diagram illustrating another cell array according to an example embodiment.

Referring to FIG. 12, a cell array 1c of FIG. 12 according to an example embodiment may have an alignment key AK that is in the scribelane region SR. The alignment key AK may also be a key for controlling misalignment of the cell block CB of the cell block region CBR. Tt may be determined whether the memory cells of the cell block CB of the cell block region CBR are misaligned based on the alignment key AK. In an example embodiment, misalignment of the cell block CB may be measured using the alignment key AK together with the correction block MRCB of the dummy region DR.

Hereinafter, memory cells forming a cell block in a cell block region according to an example embodiment will be described in detail.

Figure 13:
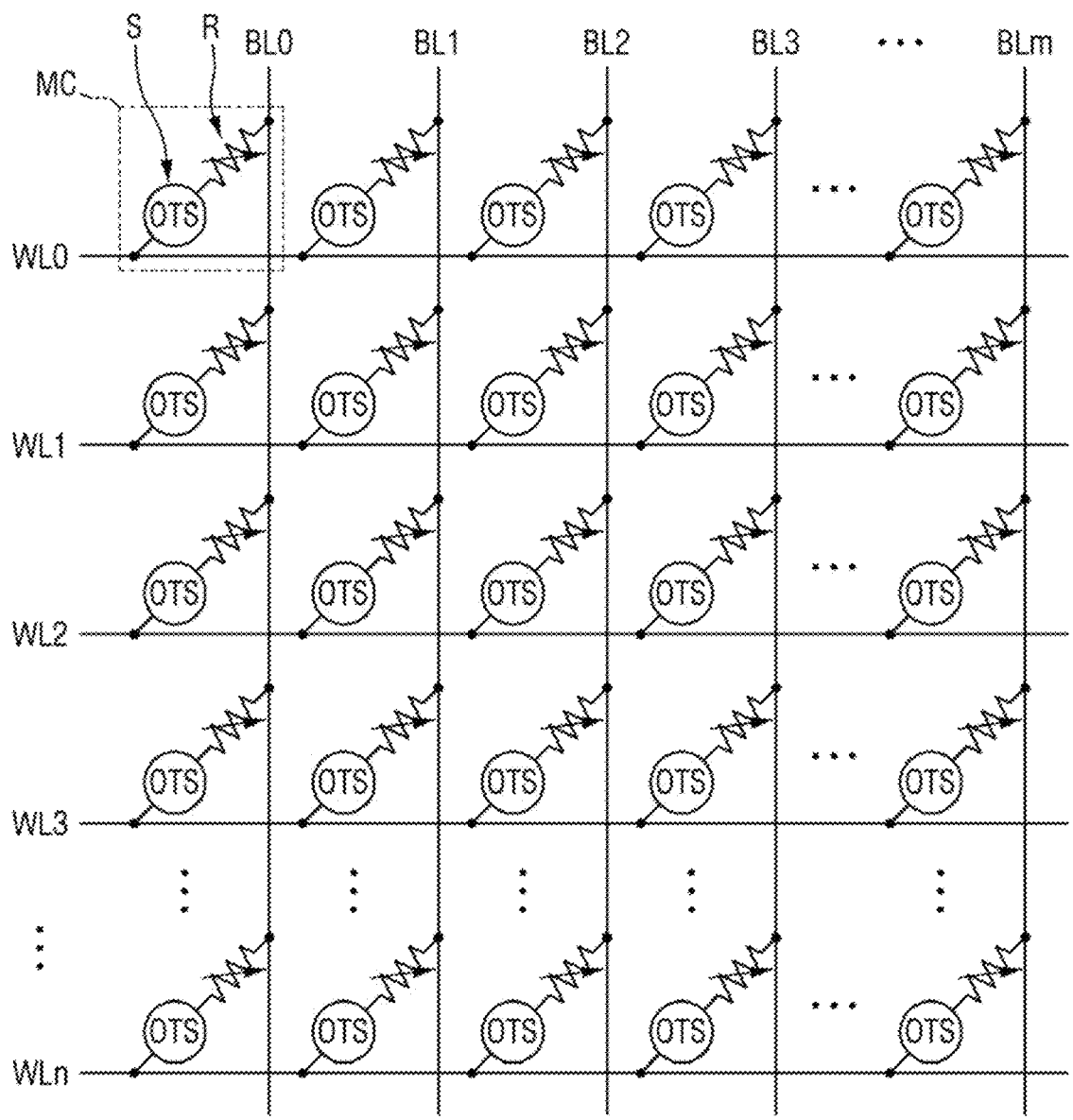
FIG. 13 is a circuit diagram illustrating a cell block in a cell block region according to an example embodiment.

FIG. 13 is a circuit diagram illustrating a cell block in a cell block region according to an example embodiment.

Referring to FIG. 13, a cell block CB1 in the cell block region according to an example embodiment may be a two-dimensional memory. When the cell block CB1 is formed of a multilayer, the cell block CB1 may be a three-dimensional memory.

The cell block CB1 may include a plurality of word lines WL0-WLn, a plurality of bit lines BL0-BLm, and a plurality of memory cells MC. The number of word lines WL, the number of bit lines BL, and the number of memory cells MC may be variously changed according to an embodiment. In addition, a set of memory cells that may be simultaneously accessed by the same word line may be defined as a page.

In the cell block CB1 according to an example embodiment, each of the plurality of memory cells MC may include a variable resistance element R and a selection element S. The variable resistance element R may be referred to as a variable resistor (or a variable resistance material), and the selection element S may be referred to as a switching element.

In the cell block CB1 according to an example embodiment, the selection element S may be an ovonic threshold switch (OTS) selector including a compound such as GeSe, GeS, AsSe, AsTe, AsS SiTe, SiSe, SiS, GeAs, SiAs, SnSe, SnTe, GeAsTe, GeAsSe, AlAsTe, AlAsSe, SiAsSe, SiAsTe, GeSeTe, GeSeSb, GaAsSe, GaAsTe, InAsSe, InAsTe, SnAsSe, SnAsTe, GeSiAsTe, GeSiAsSe, GeSiSeTe, GeSeTeSb, GeSiSeSb, GeSiTeSb, GeSeTeBi, GeSiSeBi, GeSiTeBi, GeAsSeSb, GeAsTeSb, GeAsTeBi, GeAsSeBi, GeAsSeIn, GeAsSeGa, GeAsSeAl, GeAsSeTl, GeAsSeSn, GeAsSeZn, GeAsTeIn, GeAsTeGa, GeAsTeAl, GeAsTeTl, GeAsTeSn, GeAsTeZn, GeSiAsSeTe, GeAsSeTeS, GeSiAsSeS, GeSiAsTeS, GeSiSeTeS, GeSiAsSeP, GeSiAsTeP, GeAsSeTeP, GeSiAsSeIn, GeSiAsSeGa, GeSiAsSeAl, GeSiAsSeTi, GeSiAsSeZn, GeSiAsSeSn, GeSiAsTeIn, GeSiAsTeGa, GeSiAsTeAl, GeSiAsTeTi, GeSiAsTeZn, GeSiAsTeSn, GeAsSeTeIn, GeAsSeTeGa, GeAsSeTeAl, GeAsSeTeTi, GeAsSeTeZn, GeAsSeTeSn, GeAsSeSIn, GeAsSeSGa, GeAsSeSAl, GeAsSeSTl, GeAsSeSZn, GeAsSeSSn, GeAsTeSIn, GeAsTeSGa, GeAsTeSAl, GeAsTeSTl, GeAsTeSZn, GeAsTeSSn, GeAsSeInGa, GeAsSeInAl, GeAsSeInTi, GeAsSeInZn, GeAsSeInSn, GeAsSeGaAl, GeAsSeGaTi, GeAsSeGaZn, GeAsSeGaSn, GeAsSeAlTl, GeAsSeAlZn, GeAsSEAlSn, GeAsSeTlZn, GeAsSeTiSn, GeAsSeZnSn, GeSiAsSeTeS, GeSiAsSeTeIn, GeSiAsSeTeGa, GeSiAsSeTeAl, GeSiAsSeTeTi, GeSiAsSeTeZn, GeSiAsSeTeSn, GeSiAsSeTeP, GeSiAsSeSIn, GeSiAsSeSGa, GeSiAsSeSAl, GeSiAsSeSTl, GeSiAsSeSZn, GeSiAsSeSSn, GeAsSeTeSIn, GeAsSeTeSGa, GeAsSeTeSAl, GeAsSeTeSTl, GeAsSeTeSZn, GeAsSeTeSSn, GeAsSeTePIn, GeAsSeTePGa, GeAsSeTePAl, GeAsSeTePTl, GeAsSeTePZn, GeAsSeTePSn, GeSiAsSeInGa, GeSiAsSeInAl, GeSiAsSeInTi, GeSiAsSeInZn, GeSiAsSeInSn, GeSiAsSeGaAl, GeSiAsSeGaTi, GeSiAsSeGaZn, GeSiAsSeGaSn, GeSiAsSeAlSn, GeAsSeTeInGa, GeAsSeTeInAl, GeAsSeTeInTi, GeAsSeTeInZn, GeAsSeTeInSn, GeAsSeTeGaAl, GeAsSeTeGaTi, GeAsSeTeGaZn, GeAsSeTeGaSn, GeAsSeTeAlSn, GeAsSeSInGa, GeAsSeSInAl, GeAsSeSInTi, GeAsSeSInZn, GeAsSeSInSn, GeAsSeSGaAl, GeAsSeSGaTi, GeAsSeSGaZn, GeAsSeSGaSn, and GeAsSeSAlSn.

In an example embodiment, the variable resistance element R may be connected between one of the plurality of bit lines BL0 to BLm and the selection element S, and the selection element S may be connected between the variable resistance element R and one of the plurality of the word lines WL0 to WLn.

However, the present disclosure is not limited thereto, and the selection element S may be connected between one of the plurality of bit lines BL0 to BLm and the variable resistance element R, and the variable resistance element R may be connected between the selection element S and one of the plurality of word lines WL0 to WLn.

The selection element S may be connected between any one of the plurality of word lines WL0 to WLn and the variable resistance element R, and may control the current supply to the variable resistance element R according to the voltage applied to the word line and the bit line that are connected.

Figure 14:
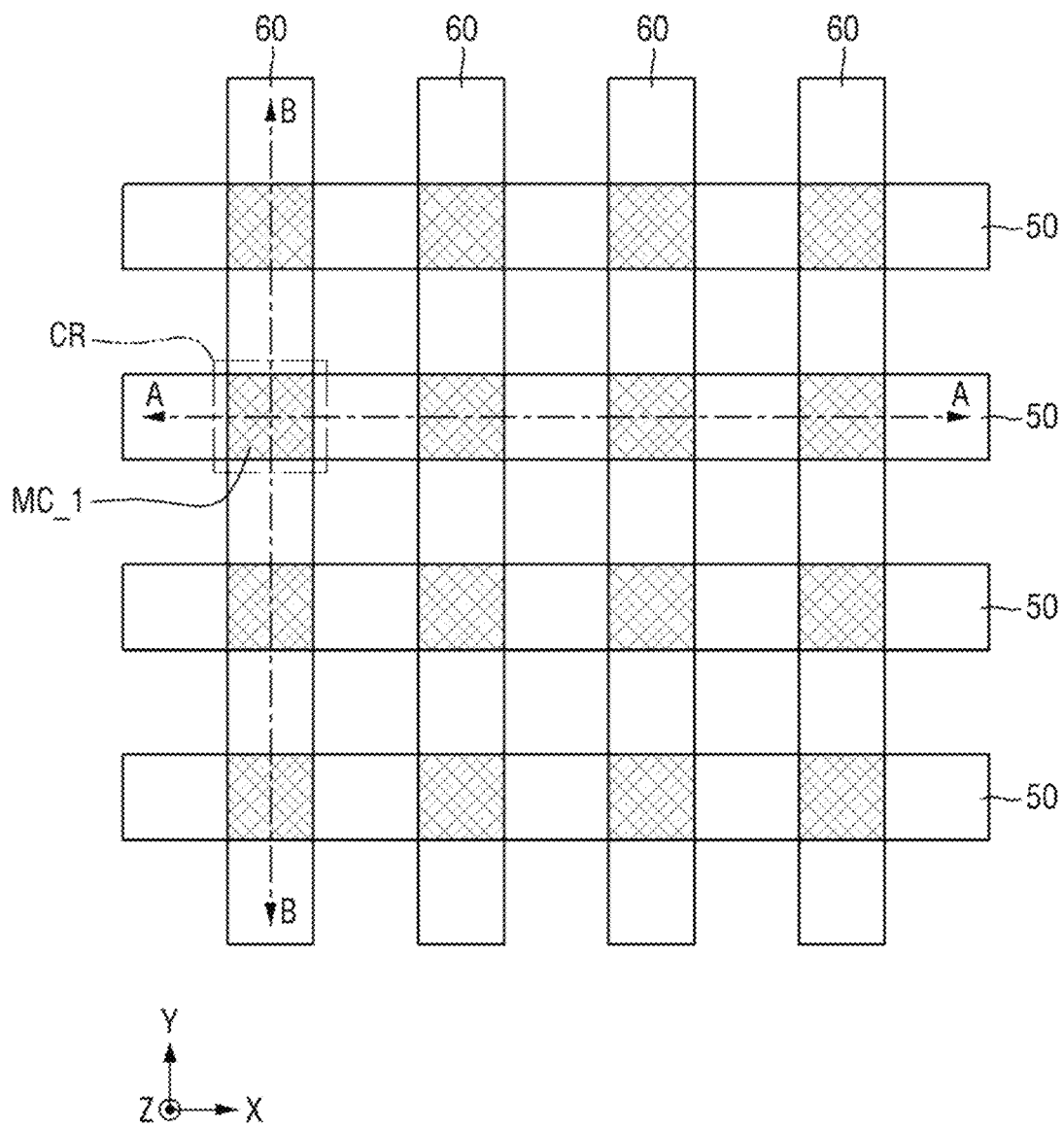
FIG. 14 is a layout diagram illustrating the cell block of FIG. 13 according to an example embodiment.
Figure 15:
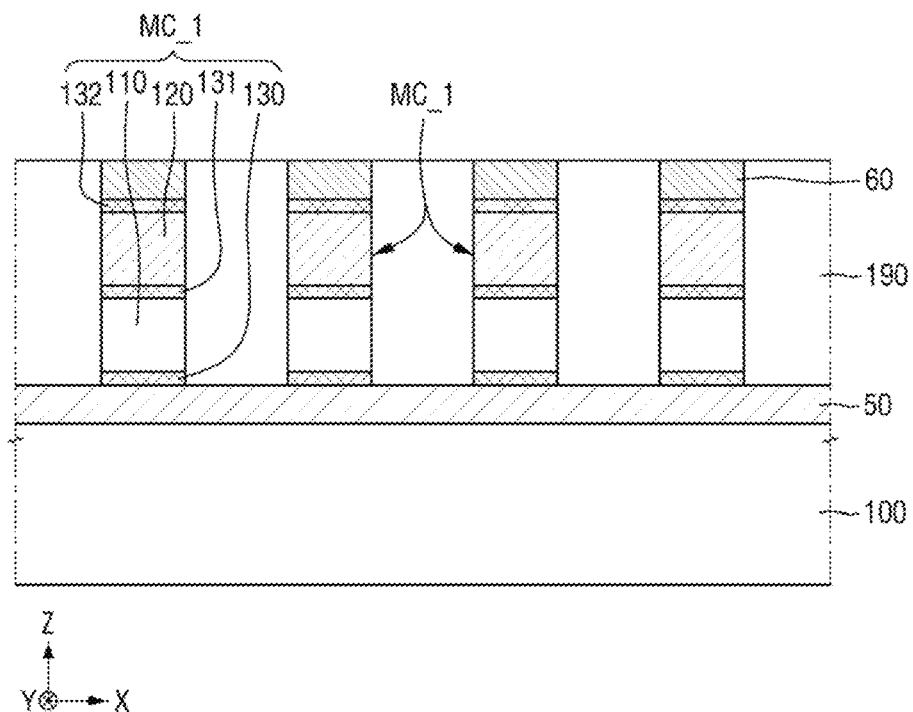
FIG. 15 is a cross-sectional view taken along line A-A of FIG. 14.
Figure 16:
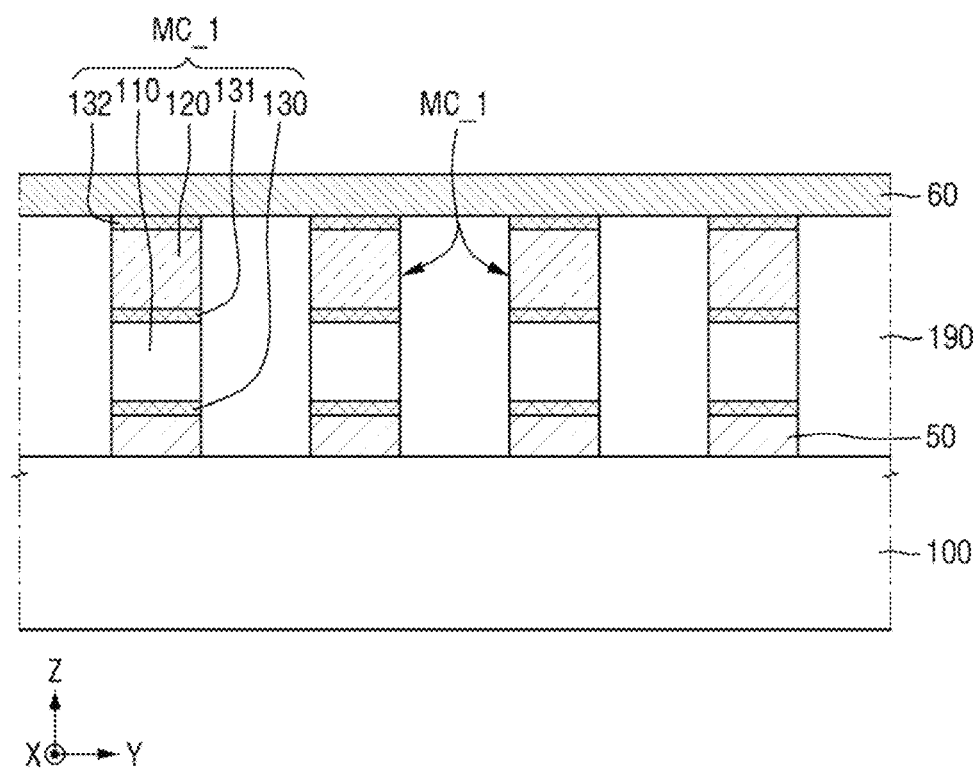
FIG. 16 is a cross-sectional view taken along B-B of FIG. 14.

FIG. 14 is a layout diagram illustrating the cell block of FIG. 13 according to an example embodiment. FIG. 15 is a cross-sectional view taken along line A-A of FIG. 14. FIG. 16 is a cross-sectional view taken along B-B of FIG. 14.

Referring to FIGS. 13 to 16, the cell block CB1 according to an example embodiment may include a plurality of first metal lines 50, a plurality of second metal lines 60, and a plurality of first memory cells MC_1.

The plurality of first metal lines 50 and the plurality of second metal lines 60 may be formed on the substrate 100. The plurality of first metal lines 50 may be formed to be spaced apart from the plurality of second metal lines 60. The plurality of first metal lines 50 may extend parallel to each other in the first direction X. The plurality of second metal lines 60 may extend parallel to each other in the second direction Y crossing the first direction X.

The substrate 100 may include a semiconductor wafer. In an example embodiment, the substrate 100 may include a semiconductor element such as Si or Ge, or a compound semiconductor such as SiC, GaAs, InAs, and InP. In an example embodiment, the substrate 100 may have a silicon on insulator (SOI) structure or a silicon-germanium on insulator (SGOI) structure. In an example embodiment, the substrate 100 may include a buried oxide layer (BOX). In an example embodiment, the substrate 100 may include a conductive region, e.g., a well doped with impurities, or a structure doped with impurities.

Although not illustrated, a structure including a plurality of gates, at least one interlayer insulating layer, a plurality of contacts, a plurality of wirings, and the like may be interposed between the substrate 100 and the plurality of first metal lines 50.

Each of the plurality of first metal lines 50 and the plurality of second metal lines 60 may be formed of a metal, a conductive metal nitride, a conductive metal oxide, or a combination thereof.

In an example embodiment, each of the plurality of first metal lines 50 and the plurality of second metal lines 60 may be formed of W, WN, Au, Ag, Cu, Al, TiAlN, Ir, Pt, Pd, Ru, Zr, Rh, Ni, Co, Cr, Sn, Zn, ITO, an alloy thereof, or a combination thereof.

In an example embodiment, each of the plurality of first metal lines 50 and the plurality of second metal lines 60 may include a metal layer and a conductive barrier layer covering at least a portion of the metal layer. The conductive barrier layer may be formed of, e.g., Ti, TiN, Ta, TaN, or a combination thereof, but is not limited thereto.

Each of the plurality of first metal lines 50 and the plurality of second metal lines 60 may be constituted with a plurality of stripe patterns crossing each other. The plurality of first memory cells MC_1 (MC in FIG. 13) may be formed at a plurality of crossing points CP between the plurality of first metal lines 50 and the plurality of second metal lines 60, respectively. The plurality of first memory cells MCI may form a cross point array structure.

At the plurality of crossing points CP between the plurality of first metal lines 50 and the plurality of second metal lines 60, each of the plurality of first memory cells MCI may be disposed between the first metal line 50 and the second metal line 60 that cross each other.

Each of the plurality of first memory cells MC_1 may have a pillar shape extending in the third direction Z.

In FIGS. 14 to 16, the cross section of the plurality of first memory cells MC_1 in the XY plane is illustrated to have a substantially rectangular shape, but they may have a cross-sectional structure of various shapes. For example, a cross-sectional shape of the plurality of first memory cells MC_1 in the XY plane may have various shapes such as a semi-circle, a half ellipse, a trapezoid, and a triangle.

Each of the plurality of first memory cells MC_1 may store digital information. The plurality of first memory cells MCI may store digital information by a change in resistance between various resistance states including a high resistance state and a low resistance state. Each of the plurality of first memory cells MC_1 may include at least one different material layer.

Each of the plurality of first memory cells MC_1 may include a first memory layer 120, a first selection element layer 110, a first top electrode 132, a first bottom electrode 130, and a first intermediate electrode 131.

The first top electrode 132 and the first bottom electrode 130 may be spaced apart from each other. The first top electrode 132 may be connected to, e.g., one of the plurality of second metal lines 60. The first bottom electrode 130 may be connected to, e.g., one of the plurality of first metal lines 50.

The first selection element layer 110 and the first memory layer 120 may be disposed between the first top electrode 132 and the first bottom electrode 130. The first selection element layer 110 may be disposed between the first top electrode 132 and the first bottom electrode 130. For example, the first selection element layer 110 may be formed more adjacent to the first bottom electrode 130 than to the first top electrode 132. The first selection element layer 110 may be electrically connected to the first bottom electrode 130. The first memory layer 120 may be disposed between the first top electrode 132 and the first selection element layer 110. For example, the first memory layer 120 may be formed more adjacent to the first top electrode 132 rather than to the first bottom electrode 130. The first memory layer 120 may be electrically connected to the first top electrode 132.

In FIGS. 15 and 16, the first selection element layer 110 is illustrated to be disposed more adjacent to the substrate 100 than to the first memory layer 120, but the first memory layer 120 may be disposed more adjacent to the substrate 100 than to the first selection element layer 110.

The first intermediate electrode 131 may be disposed between the first memory layer 120 and the first selection element layer 110. The first intermediate electrode 131 may be electrically connected to each of the first memory layer 120 and the first selection element layer 110. For example, the selection element S of FIG. 13 may correspond to the first selection element layer 110, the first bottom electrode 130, and the first intermediate electrode 131. The variable resistance element R of FIG. 13 may correspond to the first memory layer 120, the first top electrode 132, and the first intermediate electrode 131.

In an example embodiment, the first bottom electrode 130, the first intermediate electrode 131, and the first top electrode 132 may each include, e.g., a metal such as tungsten (W), platinum (Pt), palladium (Pd), rhodium (Rh), ruthenium (Ru), iridium (Ir), copper (Cu), aluminum (Al), titanium (Ti), and tantalum (Ta). In an example embodiment, the first bottom electrode 130, the first intermediate electrode 131, and the first top electrode 132 may each include, e.g., metal nitride or metal silicon nitride such as titanium nitride (TiNx), titanium silicon nitride (TiSiNx), tungsten nitride (WNx), tungsten silicon nitride (WSiNx), tantalum nitride (TaNx), tantalum silicon nitride (TaSiNx), zirconium nitride (ZrNx), and zirconium silicon nitride (ZrSiNx). In an example embodiment, the first bottom electrode 130, the first intermediate electrode 131, and the first top electrode 132 may each include a conductive oxide of the above-described material.

The first memory layer 120 may include a resistance change layer whose resistance is changed according to an electric field. In an example embodiment, when the first memory layer 120 includes a transition metal oxide, the cell block CB1 may be a cell block including a resistance RAM (RRAM) memory cell.

In an example embodiment, the first memory layer 120 may be formed of a phase change material whose resistance changes according to the temperature, and the cell block CB1 may be a cell block including a phase change RAM (PRAM) cell.

In an example embodiment, the first memory layer 120 may have a magnetic tunnel junction (MTJ) structure including two electrodes formed of a magnetic material and a dielectric interposed between the two magnetic material electrodes, and the nonvolatile memory device of the present disclosure may be a magnetic RAM (MRAM).

In an example embodiment, the first memory layer 120 may be formed of various types of compounds. In an example embodiment, the first memory layer 120 may be formed of a material in which impurities are added to various types of compounds. In an example embodiments, the first memory layer 120 may include a resistance change layer and at least one barrier layer and/or at least one conductive layer covering at least a portion of the resistance change layer.

The first memory layer 120 may be formed of a transition metal oxide, and the transition metal oxide may contain at least one metal selected from Ta, Zr, Ti, Hf, Mn, Y, Ni, Co, Zn, Nb, Cu, Fe, or Cr. For example, the transition metal oxide may be formed as a single layer or multiple layers made of at least one material selected from $Ta_2O_{5-x}$, $ZrO_{2-x}$, $TiO_{2-x}$, $HfO_{2-x}$, $MnO_{2-x}$, $Y_2O_{3-x}$, $NiO_{1-y}$, $Nb_2O_{5-x}$, $CuO_{1-y}$, or $Fe_2O_{3-x}$. In the exemplified materials, x and y may be selected within the range of $0 \leq x \leq 1.5$ and $0 \leq y \leq 0.5$, respectively, but are not limited thereto.

The first memory layer 120 may be made of a phase change material whose resistance state is changed by Joule heat generated by a voltage applied to both ends, and examples of the phase change material may include a combination of two elements such as GeTe, GeSe, GeS, SbSe, SbTe, SbS, SbSe, SnSb, InSe, InSb, AsTe, AlTe, GaSb, AlSb, BiSb, ScSb, Ysb, CeSb, DySb, or NdSb, a combination of three elements such as GeSbSe, AlSbTe, AlSbSe, SiSbSe, SiSbTe, GeSeTe, InGeTe, GeSbTe, GeAsTe, SnSeTe, GeGaSe, BiSbSe, GaSeTe, InGeSb, GaSbSe, GaSbTe, InSbSe, InSbTe, SnSbSe, SnSbTe, ScSbTe, ScSbSe, ScSbS, YSbTe, YSbSe, YSbS, CeSbTe, CeSbSe, CeSbS, DySbTe, DySbSe, DySbS, NdSbTe, NdSbSe, or NdSbS, a combination of four elements such as GeSbTeS, BiSbTeSe, AgInSbTe, GeSbSeTe, GeSnSbTe, SiGeSbTe, SiGeSbSe, SiGeSeTe, BiGeSeTe, BiSiGeSe, BiSiGeTe, GeSbTeBi, GeSbSeBi, GeSbSeIn, GeSbSeGa, GeSbSeAl, GeSbSeTl, GeSbSeSn, GeSbSeZn, GeSbTeIn, GeSbTeGa, GeSbTeAl, GeSbTeTl, GeSbTeSn, GeSbTeZn, ScGeSbTe, ScGeSbSe, ScGeSbS, YGeSbTe, YGeSbSe, YGeSbS, CeGeSbTe, CeGeSbSe, CeGeSbS, DyGeSbTe, DyGeSbSe, DyGeSbS, NdGeSbTe, NdGeSbSe, or NdGeSbS, and a combination of five elements such as InSbTeAsSe, GeScSbSeTe, GeSbSeTeS, GeScSbSeS, GeScSbTeS, GeScSeTeS, GeScSbSeP, GeScSbTeP, GeSbSeTeP, GeScSbSeIn, GeScSbSeGa, GeScSbSeAl, GeScSbSeTl, GeScSbSeZn, GeScSbSeSn, GeScSbTeIn, GeScSbTeGa, GeSbAsTeAl, GeScSbTeTl, GeScSbTeZn, GeScSbTeSn, GeSbSeTeIn, GeSbSeTeGa, GeSbSeTeAl, GeSbSeTeTl, GeSbSeTeZn, GeSbSeTeSn, GeSbSeSIn, GeSbSeSGa, GeSbSeSAl, GeSbSeSTl, GeSbSeSZn, GeSbSeSSn, GeSbTeSIn, GeSbTeSGa, GeSbTeSAl, GeSbTeSTl, GeSbTeSZn, GeSbTeSSn, GeSbSeInGa, GeSbSeInAl, GeSbSeInTi, GeSbSeInZn, GeSbSeInSn, GeSbSeGaAl, GeSbSeGaTi, GeSbSeGaZn, GeSbSeGaSn, GeSbSeAlTl, GeSbSeAlZn, GeSbSeAlSn, GeSbSeTlZn, GeSbSeTlSn, or GeSbSeZnSn. In addition, in order to improve the characteristics of the first memory layer 120, boron (B), nitrogen (N), silicon (Si), carbon (C), or oxygen (O) may be doped into the above-described phase change material. In addition, the first memory layer 120 may be formed as a plurality of layers.

The first memory layer 120 may have an MTJ structure, and the MTJ structure may include a magnetized pinned layer, a magnetized free layer, and a tunnel barrier interposed therebetween. The tunnel barrier may be formed of an oxide of a material selected from Mg, Ti, Al, MgZn, and MgB, but is not limited thereto.

In the following description, the first memory layer 120 will be mainly described to include a phase change material whose resistance state is changed by Joule heat.

The selection element (S in FIG. 13) including the first selection element layer 110, the first bottom electrode 130, and the first intermediate electrode 131 may be a current adjustment element capable of controlling the flow of current. For example, the selection element S may control the flow of current so that the first memory layer 120 may be changed to an amorphous or crystalline state. Thus, the selection element S may serve as a switch of a memory for changing the state of the first memory layer 120 to one of on and off.

By way of summation and review, as elements are gradually integrated and miniaturized, a net-die per shot of photo alignment may decrease, resulting in an increase in chip size. Thus, an effective scribe area in which an alignment key may be disposed may be reduced, along with the decrease in the number of the net-die during the process of one shot. In addition, accuracy and correction of alignment may be more difficult with an increase in the chip size, and product characteristics may be affected according to a degree of alignment.

Embodiments may provide a nonvolatile memory device with improved misalignment control accuracy. Embodiments may allow for an increase in the accuracy of misalignment control by utilizing an alignment key in a scribe lane and in a dummy region in a core region.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A memory device, comprising:
   a cell block in a cell block region, and including a plurality of memory cells;
   a control logic in a core region adjacent to the cell block region, and configured to control the cell block; and
   a correction block in a dummy region in the core region, and including a plurality of correction patterns,
   wherein:
   the correction block includes:
   a plurality of first metal lines extending in a first direction;
   a plurality of vias extending in a second direction crossing the first direction; and
   a plurality of second metal lines extending in a third direction crossing the first direction and the second direction,
   each of the plurality of second metal lines has a metal center line defining a center of each of the plurality of second metal lines in the first direction,
   each of the plurality of vias has a via center line defining a center of each of the plurality of vias in the first direction, and
   at least one metal center line of the plurality of second metal lines and at least one via center line of the plurality of vias are spaced apart from each other by a first gap in the first direction.

2. The memory device as claimed in claim 1, wherein the plurality of memory cell are phase-change random access memory (PRAM) cells.

3. The memory device as claimed in claim 2, wherein the plurality of memory cells are magnetic random access memory (MRAM) cells.

4. The memory device as claimed in claim 1, wherein the first gap is ¼ of a pitch of the plurality of second metal lines.

5. The memory device as claimed in claim 1, wherein the first gap is ⅛ of a pitch of the plurality of second metal lines.

6. The memory device as claimed in claim 1, wherein at least one metal center line of the plurality of second metal lines and at least one via center line of the plurality of vias are centered with each other.

7. The memory device as claimed in claim 1, wherein at least one metal center line of the plurality of second metal lines and at least one via center line of the plurality of vias are spaced apart from each other by a second gap in the first direction, and the second gap is different from the first gap.

8. The memory device as claimed in claim 7, wherein at least one metal center line of the plurality of second metal lines and at least one via center line of the plurality of vias are spaced apart from each other by a third gap in the first direction, and the third gap is different from the second gap.

9. The memory device as claimed in claim 8, wherein the third gap is different from the first gap.

10. The memory device as claimed in claim 8, wherein the first gap is greater than the second gap, and the second gap is greater than the third gap.

11. The memory device as claimed in claim 8, wherein the first to third gaps are the same.

12. The memory device as claimed in claim 1, further comprising a scribelane region adjacent to the cell block region,
wherein an alignment key for measuring an alignment error of the plurality of memory cells is in the scribelane region.

13. A memory device, comprising:
a first region having a cell block including a plurality of memory cells for storing data;
a second region having a control logic for controlling transmission of the data, the second region being adjacent to the first region; and
a third region having a correction block including a plurality of correction patterns for measuring an alignment error of the plurality of memory cells, the third region being in the second region, wherein:
the correction block includes:
a plurality of first metal lines extending in a first direction;
a plurality of vias extending in a second direction crossing the first direction; and
a plurality of second metal lines extending in a third direction crossing the first direction and the second direction,
each of the plurality of second metal lines has a metal center line defining a center of each of the plurality of second metal lines in the first direction,
each of the plurality of vias has a via center line defining a center of each of the plurality of vias in the first direction, and
at least one metal center line of the plurality of second metal lines and at least one via center line of the plurality of vias are spaced apart from each other by a first gap in the first direction.

14. The memory device as claimed in claim 13, wherein the plurality of memory cells are phase-change random access memory (PRAM) cells.

15. The memory device as claimed in claim 13, wherein the plurality of memory cells are magnetic random access memory (MRAM) cells.

16. The memory device as claimed in claim 13, wherein the first gap is ¼ of a pitch of the plurality of second metal lines.

17. The memory device as claimed in claim 13, wherein at least one metal center line of the plurality of second metal lines and at least one via center line of the plurality of vias are centered with each other.

18. The memory device as claimed in claim 13, wherein at least one metal center line of the plurality of second metal lines and at least one via center line of the plurality of vias are spaced apart from each other by a second gap in the first direction, and the second gap is different from the first gap.

19. The memory device as claimed in claim 13, further comprising a fourth region adjacent to the first region and configured to delimit a boundary of the cell block,
wherein an alignment key for measuring an alignment error of the plurality of memory cells is in the fourth region.

20. A memory device, comprising:
a cell array configured to store data;
a row decoder configured to transmit the data to the cell array;
a column decoder configured to read the data from the cell array;
a read/write circuit configured to apply a bias to the column decoder; and
a control logic configured to control the row decoder and the read/write circuit, wherein:
the cell array includes:
a cell block in a cell block region and including a plurality of memory cells;
a control logic in a core region adjacent to the cell block region and configured to control the cell block; and
a correction block in a dummy region formed in the core region and including a plurality of correction patterns,
the correction block includes:
a plurality of first metal lines extending in a first direction;
a plurality of vias extending in a second direction crossing the first direction; and
a plurality of second metal lines extending in a third direction crossing the first direction and the second direction,
each of the plurality of second metal lines has a metal center line defining a center of each of the plurality of second metal lines in the first direction,
each of the plurality of vias has a via center line defining a center of each of the plurality of vias in the first direction, and
at least one metal center line of the plurality of second metal lines and at least one via center line of the plurality of vias are spaced apart from each other by a first gap in the first direction.

* * * * *